(12) United States Patent
Ward

(10) Patent No.: US 9,515,222 B2
(45) Date of Patent: Dec. 6, 2016

(54) GALLIUM NITRIDE ON 3C—SIC COMPOSITE WAFER

(71) Applicant: Anvil Semiconductors Limited, Warwickshire (GB)

(72) Inventor: Peter Ward, Cambridgeshire (GB)

(73) Assignee: Anvil Semiconductors Limited, Warwickshire (GB)

( * ) Notice: Subject to any disclaimer, the term of this patent is extended or adjusted under 35 U.S.C. 154(b) by 0 days.

(21) Appl. No.: 14/965,034

(22) Filed: Dec. 10, 2015

(65) Prior Publication Data

US 2016/0247967 A1 Aug. 25, 2016

Related U.S. Application Data

(63) Continuation-in-part of application No. 14/350,916, filed as application No. PCT/GB2012/052627 on Oct. 23, 2012.

(30) Foreign Application Priority Data

Oct. 26, 2011 (GB) .................................. 1118502.2

(51) Int. Cl.
*H01L 33/00* (2010.01)
*H01L 33/12* (2010.01)
*H01L 21/02* (2006.01)
*H01L 33/32* (2010.01)

(52) U.S. Cl.
CPC ........... *H01L 33/12* (2013.01); *H01L 21/0254* (2013.01); *H01L 21/0259* (2013.01); *H01L 21/0262* (2013.01); *H01L 21/02381* (2013.01); *H01L 21/02447* (2013.01); *H01L 21/02513* (2013.01); *H01L 33/007* (2013.01); *H01L 33/0095* (2013.01); *H01L 33/32* (2013.01)

(58) Field of Classification Search
CPC ........................... H01L 21/02381; H01L 33/12
See application file for complete search history.

(56) References Cited

U.S. PATENT DOCUMENTS

| 6,342,404 B1 | 1/2002 | Shibata et al. |
| 2003/0036247 A1 | 2/2003 | Eriksen et al. |
| 2010/0189981 A1 | 7/2010 | Poblenz et al. |

FOREIGN PATENT DOCUMENTS

WO    WO 2006/060339 A2    6/2006

OTHER PUBLICATIONS

International Search Report for corresponding International Application No. PCT/GB2012/052627 mailed Apr. 23, 2013.

(Continued)

*Primary Examiner* — Marc Armand
*Assistant Examiner* — Sarah Salerno
(74) *Attorney, Agent, or Firm* — Renner, Otto, Boisselle & Sklar, LLP

(57) ABSTRACT

We disclose a semiconductor structure comprising a monocrystalline silicon wafer; spaced apart monocrystalline silicon carbide layers disposed directly on the silicon wafer; amorphous and/or polycrystalline silicon carbide layers disposed directly on the silicon wafer between the monocrystalline silicon carbide layers; first gallium nitride layers disposed on the monocrystalline silicon carbide layers; and second gallium nitride layers disposed on the amorphous and/or polycrystalline silicon carbide layers.

30 Claims, 6 Drawing Sheets

(56) References Cited

OTHER PUBLICATIONS

Edgar et al., "Selective epitaxial growth of silicon carbide on SiO2 masked Si(100): The effects of temperature", Journal of Applied Physics, American Institute of Physics, New York, NY, US, vol. 84, No. 1, Jul. 1, 1998, pp. 201-204, XP012045156.
Wu et al., "A comparison of SiO2 and Si3N4 masks for selective epitaxial growth of 3C-SiC films on Si", Materials Science Forum, Trans Tech Publications Ltd., Switzerland, vol. 353-356, Jan. 1, 2001, pp. 171-174, XP009166208.
Nishino et al., "Lateral over-growth of 3C-SiC on patterned Si(111) substrates", Journal of Crystal Growth, Elsevier, Amsterdam, NL, vol. 237-239, Apr. 1, 2002, pp. 1250-1253, XP004355976.
K. Teker, Selective epitaxial growth of 3C-SiC on patterned Si using hexamethyldisilane by APCVC, Journal of Crystal Growth, Elseiver, Amsterdam, NL, vol. 257, No. 3-4, Oct. 1, 2003, pp. 245-254, XP004452937.
Gupta et al., "Selective epitaxy and lateral overgrowth of 3C-SiC on Si-A review", Progress in Crystal Growth and Characterization of Materials, Elsevier Publishing, Barking, GB, vol. 51, No. 1-3, Jan. 1, 2005, pp. 43-69, XP027827904.
Gwo et al., "Selective-area chemical-vapor deposition of Si using a bilayer dielectric mask patterned by proximal probe oxidation", Journal of Vacuum Science and Technology; Part A, AVS/AIP, Melville, NY, US, vol. 19, No. 4, Jul. 1, 2001, pp. 1806-1811, XP012005718.
Office Action for corresponding European Application No. 12780270.0 mailed Jul. 10, 2015.
International Preliminary Report on Patentability for corresponding International Application No. PCT/GB2012/052627 mailed May 8, 2014.
Current claims of related U.S. Appl. No. 14/350,916.

GALLIUM NITRIDE ON 3C—SIC COMPOSITE WAFER

FIELD OF THE INVENTION

This invention relates to growing cubic gallium nitride (GaN) on a 3-step silicon carbide (3C—SiC) composite wafer, particularly but not exclusively, relates to reducing material stress in cubic GaN formed on SiC composite wafer and to bow reduction in the wafer.

BACKGROUND TO THE INVENTION

There is a considerable interest around the world in growing GaN on silicon (Si) wafer for light emitting diodes (LEDs) and power devices. However, the heterogrowth process for forming GaN on Si wafer presents the same stress problems that have been faced with silicon carbide (SiC) on Si.

It has been demonstrated by the "Anvil Grid" process that the use of a silicon dioxide ($SiO_2$) grid between die which is destroyed during the temperature ramp to the growth temperature (Carbonisation) produces a growth in these grid regions of polycrystalline SiC. This produces a low stress region between the monocrystalline SiC die which inevitably contain a tensile stress. In this way stresses are developed across die dimensions rather than the whole wafer diameter and the wafer bow is reduced.

It is an aim of the present invention to reduce wafer bow when GaN is formed on a SiC wafer.

SUMMARY

The present invention seeks to address the problem of wafer bow and/or other mechanical deficiencies when growing GaN on a SiC composite wafer, particularly having a SiC layer on a Si wafer. The growth of GaN on SiC composite wafer can be used in LED applications.

According to one aspect of the present invention, there is provided a semiconductor structure comprising:
  a monocrystalline silicon wafer;
  spaced apart monocrystalline silicon carbide layers disposed directly on the silicon wafer;
  amorphous and/or polycrystalline silicon carbide layers disposed directly on the silicon wafer between the monocrystalline silicon carbide layers;
  first gallium nitride layers disposed on the monocrystalline silicon carbide layers; and
  second gallium nitride layers disposed on the amorphous and/or polycrystalline silicon carbide layers.

The silicon carbide layers may comprise 3-step cubic silicon carbide.

The first gallium nitride layers may comprise monocrystalline cubic gallium nitride. The second gallium nitride layers may comprise amorphous and/or polycrystalline gallium nitride. The amorphous and/or polycrystalline gallium nitride layers may be a cubic GaN layer or a hexagonal GaN layer.

The first gallium nitride layers may be disposed directly on the monocrystalline silicon carbide layers.

The second gallium nitride layers may be disposed directly on the amorphous and/or polycrystalline silicon carbide layers.

The second gallium nitride layers may be configured to reduce wafer stress and bow-causing forces.

A light emitting diode may incorporate the semiconductor structure.

According to a further aspect of the present invention, there is provided a method for forming cubic gallium nitride on silicon carbide layers formed on a silicon wafer, the method comprising:
  providing a monocrystalline silicon wafer;
  forming spaced apart monocrystalline silicon carbide layers directly on the silicon wafer;
  forming amorphous and/or polycrystalline silicon carbide layers directly on the silicon wafer between the monocrystalline silicon carbide layers;
  forming first gallium nitride layers disposed on the monocrystalline silicon carbide layers; and
  forming second gallium nitride layers disposed on the amorphous and/or polycrystalline silicon carbide layers.

The silicon carbide layers may comprise 3-step cubic silicon carbide.

The first gallium nitride layers may comprise monocrystalline cubic gallium nitride.

The second gallium nitride layers may comprise amorphous and/or polycrystalline gallium nitride. The second gallium nitride layers may comprise polycrystalline cubic gallium nitride. The second gallium nitride layers may be cubic gallium nitride layers. Alternatively the second gallium nitride layers may be hexagonal gallium nitride layers.

The growth of the mono- and poly-types gallium nitride layers in segments is particularly advantageous because the wafer bow reduction technique applicable in the SiC composite wafer is equally applicable in the GaN layers formed on the SiC wafer. In particular, this is advantageous because when GaN is grown over the entire SiC wafer then the mono-type GaN segments and poly-type GaN segments substantially neutralise one another's stress across the entire wafer to reduce wafer bow.

The forming spaced apart monocrystalline silicon carbide layers may comprise:
  forming a masking layer having windows which expose corresponding regions of the silicon wafer, and
  forming the monocrystalline silicon carbide layers on the exposed regions of the wafer.

The forming amorphous and/or polycrystalline silicon carbide layers comprise:
  consuming the masking layer at an elevated temperature which results in further exposed regions of the silicon wafer adjacent the monocrystalline silicon carbide layers; and
  forming amorphous and/or polycrystalline silicon carbide layers on the further exposed regions of the silicon wafer.

The elevated temperature may be about or above 1300° C. The elevated temperature may be about 1370° C.

The silicon carbide layers may be formed on the silicon wafer using a reduced pressure chemical vapour deposition (RPCVD).

The forming of the first gallium nitride layers may comprise forming cubic monocrystalline gallium nitride on the monocrystalline silicon carbide layers. The cubic monocrystalline gallium nitride includes tensile stress which needs to be compensated to avoid wafer bow.

The forming of the second gallium nitride layers may comprise forming polycrystalline and/or amorphous gallium nitride on the amorphous and/or polycrystalline silicon carbide layers. The second gallium nitride layers may include cubic polycrystalline gallium nitride.

The gallium nitride layers may be formed using a temperature less than about 1000° C. The gallium nitride layers may be formed using MOVPE process.

The forming of the silicon carbide may comprise forming silicon carbide having a thickness in a range between about 0.5 μm and about 5 μm. A relatively thin SiC layer (e.g. about 0.5 μm to 1 μm) can be particularly useful for the GaN growth and bow reduction in the wafer.

The forming of the silicon carbide may comprise forming silicon carbide having a thickness of about 2.5 μm. However, other thicknesses of the silicon carbide layer can be contemplated based on its suitability to reduce wafer bow.

The lateral distance between the centres of two adjacent polycrystalline silicon carbide layers may be in a range between about 0.5 mm and about 5 mm. This lateral distance can be referred as "grid pitch".

The width of each polycrystalline silicon carbide layer may be in a range between about 25 μm and 100 μm.

The width of each polycrystalline silicon carbide layer may be about 50 μm.

The method may further comprise cutting the initial Silicon dioxide mask in such a way that these cuts are reflected in the polycrystalline and/or amorphous silicon carbide layers grown. The polycrystalline layers can be referred as grid lines having intersections between them and the cut portions may be located at the intersection region. Alternatively the cut portions may be located at a region away from the intersection region. The cut portions are advantageous because they allow controlling the wafer stress locally into individual cell separated by each cut portion.

The width of the monocrystalline silicon carbide layers may be substantially the same. This results in a symmetric SiC composite wafer, particularly using an on-axis wafer.

The width of the monocrystalline silicon carbide layers may be different. This results in an asymmetric SiC composite wafer, particularly using an on axis wafer.

The wafer may be an off-axis wafer. The wafer may be an on-axis wafer.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION OF THE PREFERRED EMBODIMENTS

Referring to FIGS. 1a to 1i, an embodiment of a method of fabricating silicon carbide semiconductor devices which includes silicon carbide/silicon heteroepitaxy is described.

Figure 1A:
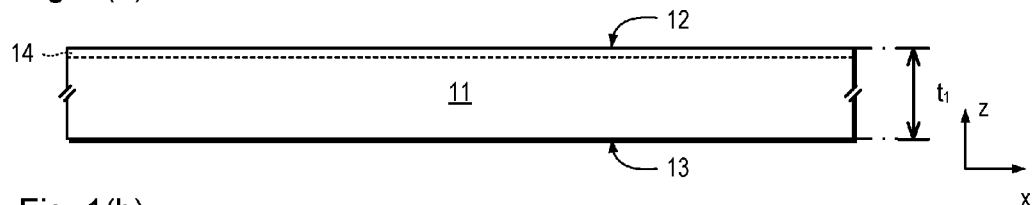
FIGS. 1a to 1i illustrate stages during a method of fabricating silicon carbide semiconductor devices including a second process of heteroepitaxy.

FIG. 1a shows a monocrystalline silicon wafer 11 at a room temperature.

The silicon wafer 11 may have an off-axis, [111] crystal orientation and may be polished on one or both sides 12, 13. The sides 12, 13 may also be referred to as "surfaces" or "faces". Other crystal orientations may be used, such as [100] on or off axis. The silicon wafer 11 has a thickness, $t_1$, and a diameter, $d_1$ (not shown). In this example, $t_1$=750 μm and $d_1$=100 mm. In an alternative example, $t_1$=about 750 μm to 1000 μm and $d_1$=150 mm The silicon wafer 11 has a wafer bow less than 25 μm and so can be considered to have substantially no bow.

The silicon wafer 11 serves as a crystal matrix on which a layer of monocrystalline three-step cubic silicon carbide can be epitaxially grown on a first side 12 of the wafer 11 (hereinafter referred to as the "upper surface") on a monocrystalline silicon surface region 14. In some embodiments, silicon-on-insulator may be used and so the monocrystalline silicon surface region 14 can take the form of a monocrystalline silicon layer, for example having a thickness of about 50 to 200 nm, disposed on a layer of silicon dioxide. However, other wafers having different layer structures, but which is mostly or predominantly comprised or made up of silicon can be used. For example, a wafer which mostly comprises silicon but which has one or a few layers of non-silicon material embedded in it may be used. Thus, the total thickness (or volume) of non-silicon material used in layers or regions of the wafer may make up no more about 1%, 0.1% or even 0.01% of the wafer, particularly when nitrogen is applied in the wafer.

Before heteroepitaxy, the silicon wafer 11 may be processed, for example, by patterning and etching the upper surface 12 and/or the lower surface 13.

Figure 1B:
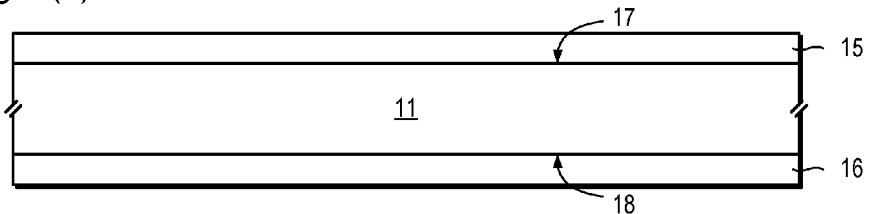

Referring in particular to FIG. 1b, first and second masking layers 15, 16 are formed at the upper and lower surfaces 12, 13 (FIG. 1a) of the silicon wafer 11.

The masking layers 15, 16 do not comprise monocrystalline silicon. The masking layers 15, 16 may comprise a dielectric material. However, a non-dielectric material (i.e. a semiconductor or conductive material) can be used. Moreover, silicon can be used, but in the form of polycrystalline silicon.

Each masking layer 15, 16 takes the form of a layer of thermal oxide and has a thickness of about 0.5 μm. The thermal oxide layers 15, 16 may be grown by wet oxidation at a temperature between about 800 and 1200° C. During thermal oxidation, silicon is sacrificially converted and so new first and second silicon surfaces 17, 18 are formed. Herein, the new first and second silicon surfaces 17, 18 are referred to as "principal surfaces".

Other dielectric materials, such silicon nitride ($Si_3N_4$), can be used. The layers 15, 16 can be formed using other processes, such as chemical vapour deposition (CVD). It will be appreciated that if the dielectric materials are deposited and silicon is not sacrificially consumed, then the (original) silicon surfaces 12, 13 form the principal surfaces 17, 18 of the wafer 11. The masking layers 15, 16 may each comprise two layers (i.e. may each be bilayers) comprising, for example, a silicon dioxide layer and an overlying silicon nitride layer. The masking layers 15, 16 need not be the same thickness and can be thinner or thicker. Suitable layer thicknesses can be found by routine experiment.

The presence of the second masking layer 16 can help to stiffen the wafer 11. Furthermore, the second masking layer 15 can help "balance" the first masking layer 15 in a way which helps reduce wafer bow during subsequent processing steps.

Figure 1C:
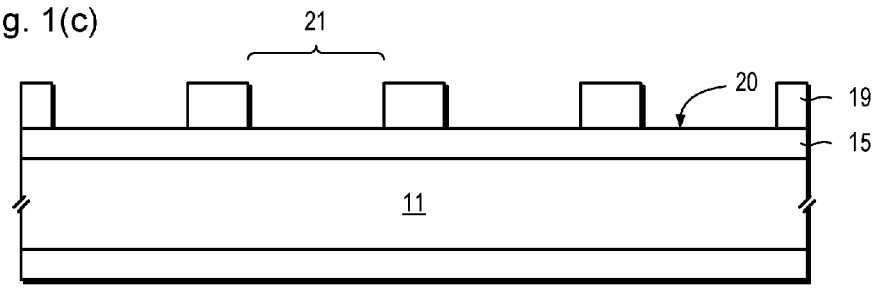

Referring to FIG. 1c, an etch mask 19 is formed on an upper layer 20 of the first masking layer 15. The etch mask 19 takes the form of a photoresist. The etch mask 19 takes the form of a rectangular grid defining an array of rectangular windows 21 which expose the upper surface 20 of the masking layer 15.

Figure 1D:
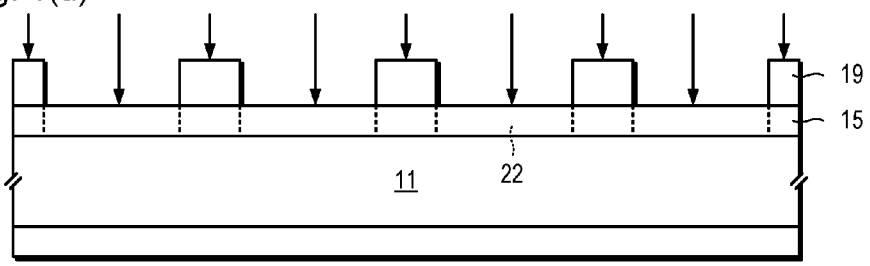

Referring in particular to FIG. 1*d*, unmasked regions 22 of the first masking layer 15 are etched so as to transfer the pattern of the etch mask 19 into the first masking layer 15. The masking layer 15 may be etched using a dry etch, such as a reactive ion etch (RIE) based on, for example, $CHF_3$ or a wet etch using buffered hydrofluoric acid (BHF). After etching, the mask 19 is removed.

Figure 1E:
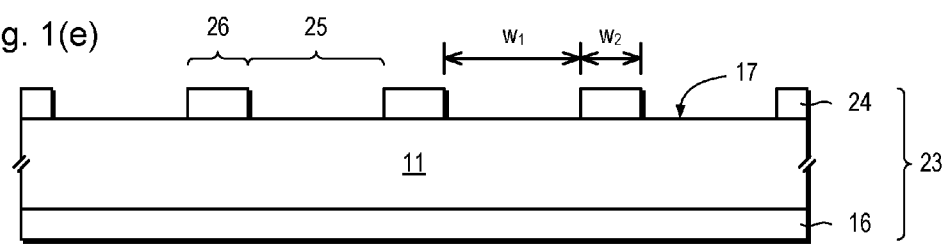

Referring in particular to FIG. 1*e*, the resulting patterned wafer 23 includes a silicon wafer 11 supporting a patterned masking layer 24 on the upper surface 17 of the wafer 11.

The masking layer 24 takes the form of a grid defining an array of windows 25 which expose the upper surface 17 of the wafer 11. The windows 25 are generally rectangular (e.g. square) having a width $w_1$ and (in a perpendicular direction) a length $l_1$ (not shown) in a range between about 0.5 mm to 5 mm. The windows 25 are spaced apart by strips 26 of masking layer material 24 having a width $w_2$ of about 25 μm to 100 μm which may later define scribe lanes and preferably the width $w_2$ is about 50 μm.

The patterned wafer 23 is cleaned, e.g. using a Piranha etch, and is placed in a reactor (not shown), such as an LPE 106 marketed by LPE S.p.A., Baranzate, Italy. The reactor chamber (not shown) is subjected to a high-vacuum bake out at about 500° C. and is re-filled with hydrogen at about 100 mbar. The patterned wafer 23 is heated via inductive heating of a susceptor (not shown).

The patterned wafer 23 may be cleaned in situ with hydrogen ($H_2$) at a temperature, $T_1$, of about 1100° C. for about 2 minutes.

The patterned wafer 23 is cooled to a low temperature in the region of 800° C. and then heated to a temperature, $T_2$, of 1370° C. in a flow of a carbon-containing gas, such as ethylene ($C_2H_4$), diluted in hydrogen ($H_2$).

Figure 1F:
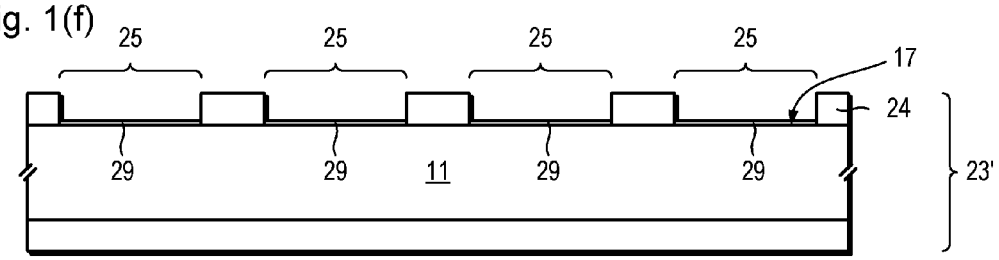

Referring in particular to FIG. 1*f*, during ramping, a thin (i.e. one, two or a few monolayers thickness) layers 29 of carbon are deposited directly on the upper surface 17 of the silicon wafer 11 in the windows 25. Carbon may also be deposited on the masking layer 24.

Figure 1G:
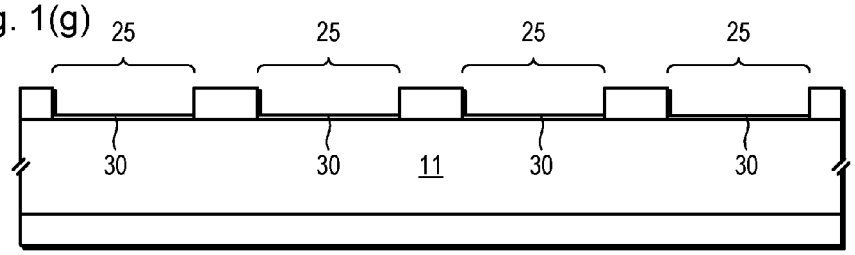

Referring also to FIG. 1*g*, the thin layers 29 (FIG. 1*f*) of carbon are converted into corresponding thin layers 30 of silicon carbide (SiC) by reacting the carbon with underlying silicon in the wafer 11. The resulting thin silicon carbon layers 30 provide seed layers for subsequent deposition of silicon carbide.

The masking layer 24 is consumed or partially-consumed by the hydrogen-rich atmosphere at the elevated temperatures. The elevated temperature is about 1370° C.

During or after temperature ramping, the feed gases are changed from those used for carbonization to those used for silicon carbide epitaxy.

Referring to FIG. 2*h*, silicon carbide is grown using a suitable silicon-carrying gas, such as trichlorosilane, $SiHCl_3$, and a suitable carbon-carrying gas, such as ethylene $C_2H_4$, at the elevated temperature, $T_2$, of 1370° C. resulting in layers 31 of monocrystalline 3-step cubic silicon carbide in the windows 25 and a layer 32 of polycrystalline, mixed polytype silicon carbide on the silicon wafer 11. The carbon-carrying gas may be ethylene, propane ($C_3H_8$) or other similar gas. The silicon-carrying gas may a silane, such as (mono) silane ($SiH_4$), a chlorosilane, such as trichlorosilane, $SiHCl_3$, or another suitable silicon-carrying gas. Silicon carbide growth may be achieved using a more complex precursor gas which includes silicon and carbon.

As explained earlier, the masking layer 24 is (partially or fully) consumed by the hydrogen-rich atmosphere. Even if the masking layer 24 does not survive, it can still serve to inhibit epitaxy (i.e. monocrystalline growth) of silicon carbide on the silicon wafer 11 in the regions between the windows 25. For example, deposition of silicon carbide results in formation of polycrystalline silicon carbide on the silicon wafer 11 in the regions between the windows 25.

The silicon carbide layer 31 may be undoped (e.g. with a background doping of the order of $10^{14}$ $cm^{-3}$), lightly-doped or doped n-type with nitrogen (N) or phosphorus (P), or p-type with aluminium (Al) or Boron (B).

The reactor chamber (not shown) is purged, filled with Argon and the temperature is ramped down. When the processed wafer 34 cools, it does not bow (or at least bow excessively) because the thermal stresses only act over the dimensions of the window 25, not the whole wafer diameter. Furthermore, the epitaxial layers 31 and underlying silicon wafer 11 do not delaminate. The epitaxial layers 31 exhibit a low density of defects, for example, less than 100 $mm^{-2}$.

Without wishing to be bound by theory, the overgrown wafer does not bow for one or more reasons. Firstly, forces caused by differences thermal expansion for silicon and silicon carbide act over smaller distances, i.e. windows 25, rather than over the whole wafer. Secondly, the presence of polycrystalline silicon carbide 32 can help to relax strain.

The silicon carbide layers 31 can be processed to form semiconductor devices, for example, power electronic devices or micro/nano electro-mechanical systems (MEMS/NEMS) devices.

Processing may include high-temperature processing steps such as gate oxidation, implant annealing etc. and low-temperature processing such as thin film deposition, lithography, dry etching and so on. A processed wafer 34 is shown in FIG. 1*i*.

As shown in FIG. 1*j*, after processing has been completed, the processed wafer 34 can be divided into dies 35 by cutting along the scribe lanes 26.

The dies 35 are then packaged and wires bonded to the dies (not shown).

Figure 2A:
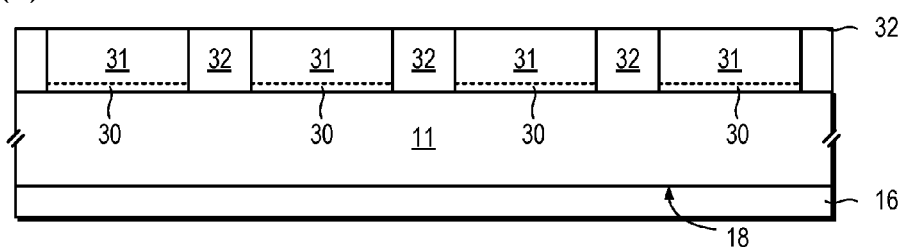
FIGS. 2a and 2b illustrate stages during a method of fabricating GaN layers on a SiC composite wafer.

Referring to FIG. 2*a*, a composite wafer including the silicon wafer 11 and 3C—SiC layers 31, 32 is illustrated. Growing a different material, such as gallium nitride (GaN), on the 3C—SiC layers 31, 32 will also cause a wafer-bow of the composite wafer due to the lattice mismatch between 3C—SiC and GaN, and temperature co-efficient during the growth process.

Figure 2B:
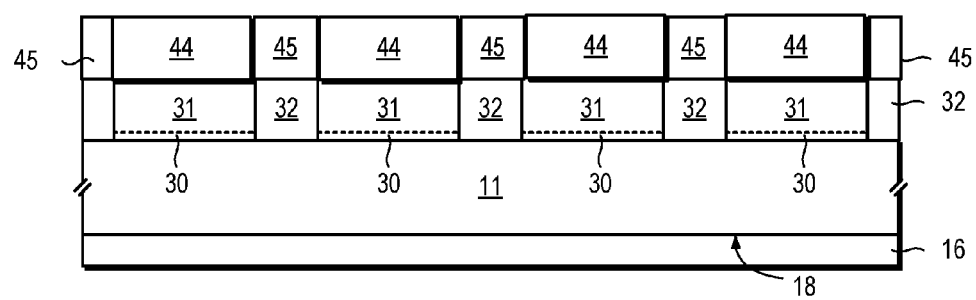

Referring to FIG. 2*b*, GaN layers 44, 45 are grown on the 3C—SiC layers 31, 32. A mono-crystalline cubic GaN layer 44 is grown by epitaxial growth on the mono-crystalline SiC layer 31 and a polycrystalline GaN layer 45 is grown on the polycrystalline SiC layer 32. The GaN layer 45 can be a cubic GaN layer. Alternatively, the GaN layer can be a hexagonal GaN layer. When a layer of GaN is grown over a SiC layer having portions of mono-crystalline SiC and portions of polycrystalline SiC, the GaN layers are formed correspondingly, i.e. the mono-crystalline cubic GaN layer 44 is formed on the mono-crystalline SiC layer 31 and the polycrystalline GaN layer 45 is formed on the polycrystalline SiC layer 32. It is understood that the polycrystalline GaN layers 45 are low stress regions which are located between the mono-crystalline cubic GaN layers having tensile stress. The low stress regions or polycrystalline GaN layers 45 compensate for the tensile stressed regions 44 and reduce the overall wafer bow after the growth of the GaN layers. The GaN tensile stress limitation to die dimensions rather than wafer dimensions may be sufficient to prevent the GaN layer from cracking.

The GaN layers 44, 45 may be cubic zincblende β-GaN. The GaN layers can be formed using Metal Organic Vapour Phase Epitaxy (MOVPE) process using a temperature less than 1000° C., preferably between 800° C. and 950° C.

Figure 3:
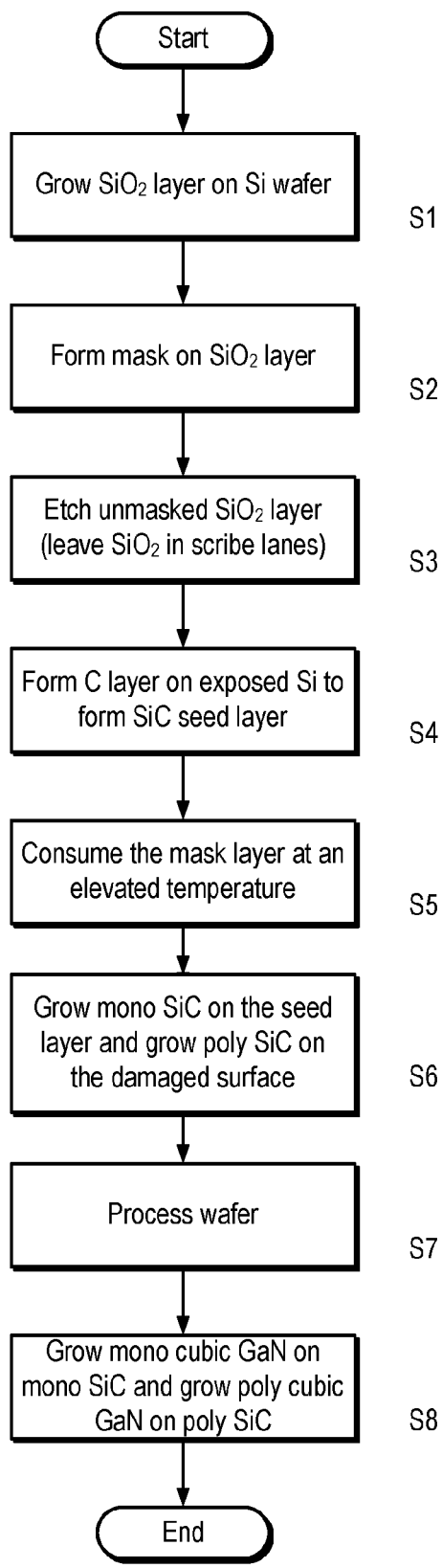
FIG. 3 illustrates a flow diagram of manufacturing the GaN layer on the SiC on Si wafer.

Referring to FIG. 3, a flow diagram of manufacturing the GaN layer on the SiC on Si wafer is illustrated.

Step 1 (S1) illustrates the growth of thermal oxide or mask layer on the silicon wafer (FIG. 1*b*)

Step 2 (S2) illustrates the formation of a mask on the thermal oxide (FIG. 1*d*).

Step 3 (S3) illustrates the etching of the unmasked thermal oxide layer to expose regions on the silicon wafer (FIG. 1*e*).

Step 4 (S4) illustrates forming a SiC seed layer on the exposed regions of the Si wafer (FIG. 1*f*).

Figure 1H:
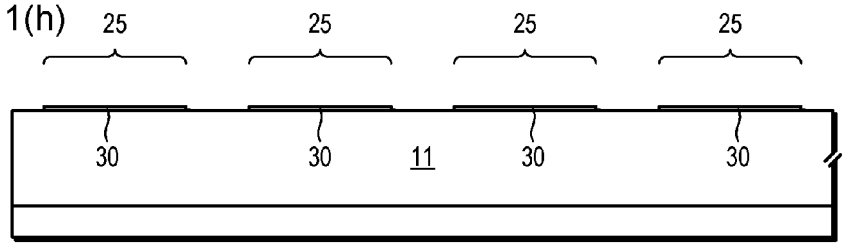
Figure 1I:
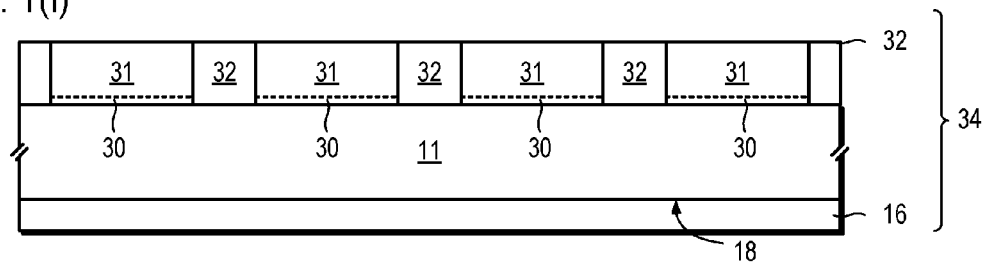

Step 5 (S5) illustrates applying an elevated temperature of about 1370° C. which results in the consumption of the mask (thermal oxide) layer (FIG. 1H).

Step 6 (S6) illustrates growing mono-crystalline SiC layer on the seed region and growing polycrystalline SiC layer on the damaged Si wafer (FIG. 1*i*).

Step 7 (S7) illustrates polishing the composite wafer so that GaN can be deposited on the composite wafer.

Step 8 (S8) illustrates growing mono-crystalline cubic GaN layer on the mono-crystalline SiC layer and growing polycrystalline GaN layer on the polycrystalline SiC layer (FIG. 2*b*). This orientation of the GaN layers reduces stress in the composite wafer to reduce wafer bow.

Figure 4:
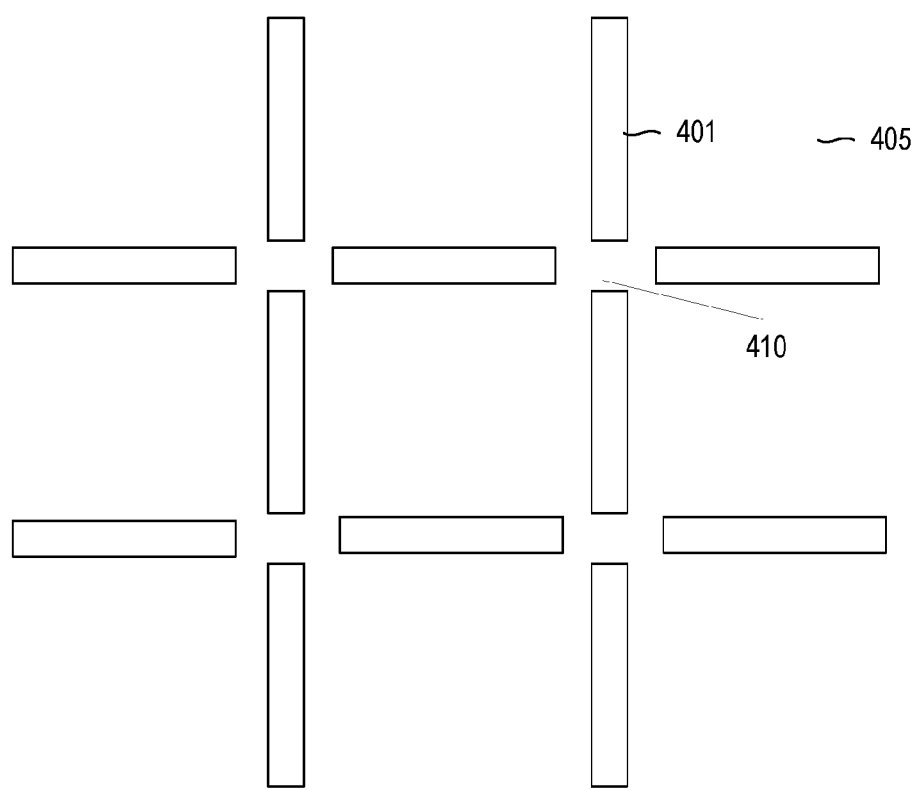
FIG. 4 illustrates a top view of a SiC composite wafer on which GaN layers are formed.

FIG. 4 illustrates a top view of a SiC composite wafer on which GaN layers are formed. In this example, the polycrystalline SiC layers 401 are represented as grid lines and the monocrystalline SiC layers 405 are located adjacent the polycrystalline SiC layers 401. The polycrystalline grid lines 401 are cut near the intersection regions 410. Since the grid lines 401 are cut, it helps to reduce stress in the wafer.

Figure 5:
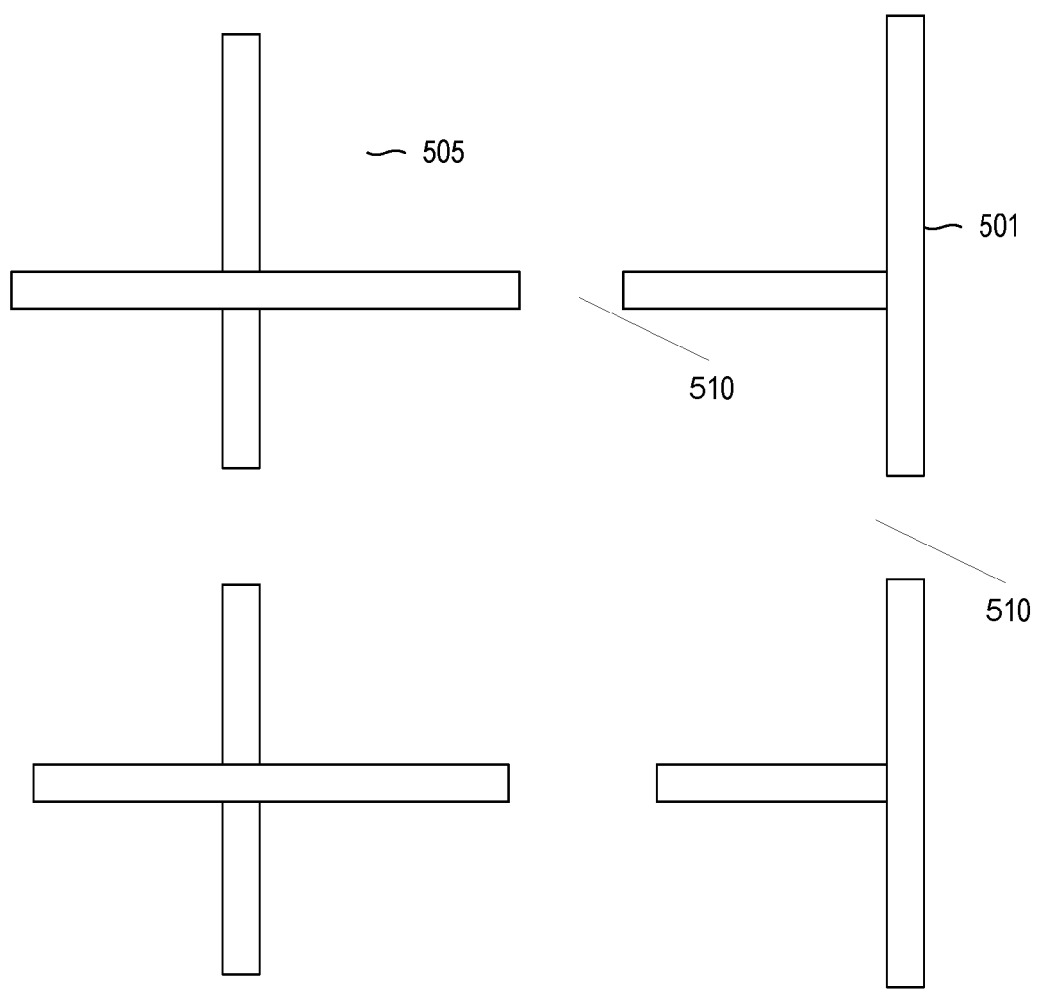
FIG. 5 illustrates a top view of an alternative SiC composite wafer on which GaN layers are formed.

FIG. 5 illustrates a top view of an alternative SiC composite wafer on which GaN layers are formed. The polycrystalline SiC layers 501 are represented as grid lines and the monocrystalline SiC layers 505 are located adjacent the polycrystalline SiC layers 501. The polycrystalline grid lines 501 are cut in regions 510 which are away from the intersection regions of the grid lines 501. These cut regions help to reduce stress in the wafer.

It is understood that the segmented GaN layers (in monoGaN and poly GaN) are capable of reducing wafer bow in the composite wafer when the GaN layers are formed on the SiC wafer. In order to achieve the same or similar effect, a silicon buffer layer may be used between the GaN layer and the SiC wafer. In this case an on-axis Si wafer should be used to generate a symmetrical stress field in the SiC.

In the context of power device applications of SiC/Si it is useful to use an off-axis Si wafer to prevent the formation of electrically active Anti Phase Boundaries (APBs). However this results in the well-known "pringle" shaped wafer which is not acceptable for MOVPE reactor growth. However, APBs may not have any effect on the GaN layer on the SiC wafer.

Although the aforementioned description is directed to growing GaN layers on 3C—SiC wafer, it would be appreciated that different layers of GaN can be grown. For example, aluminium nitride (AlN), gallium aluminium nitride (GaAlN), indium gallium nitride (InGaN), aluminium indium gallium nitride (AlInGaN) and similar nitride layers in combination can be grown.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A semiconductor structure comprising:
   a monocrystalline silicon wafer;
   spaced apart monocrystalline silicon carbide layers disposed directly on the silicon wafer;
   amorphous and/or polycrystalline silicon carbide layers disposed directly on the silicon wafer between the monocrystalline silicon carbide layers;
   first gallium nitride layers disposed on the monocrystalline silicon carbide layers; and
   second gallium nitride layers disposed on the amorphous and/or polycrystalline silicon carbide layers.

2. A semiconductor structure according to claim 1, wherein the silicon carbide layers comprise 3-step cubic silicon carbide.

3. A semiconductor structure according to claim 1, wherein the first gallium nitride layers comprise monocrystalline cubic gallium nitride.

4. A semiconductor structure according to claim 1, wherein the second gallium nitride layers comprise amorphous and/or polycrystalline gallium nitride.

5. A semiconductor structure according to claim 4, wherein the amorphous and/or polycrystalline gallium nitride layers are cubic amorphous and/or polycrystalline gallium nitride layers.

6. A semiconductor structure according to claim 1, wherein the first gallium nitride layers are disposed directly on the monocrystalline silicon carbide layers, and the second gallium nitride layers are disposed directly on the amorphous and/or polycrystalline silicon carbide layers.

7. A semiconductor structure according to claim 1, wherein the second gallium nitride layers are configured to reduce wafer stress and bow-causing forces.

8. A method for forming cubic gallium nitride on silicon carbide layers formed on a silicon wafer, the method comprising:
   providing a monocrystalline silicon wafer;
   forming spaced apart monocrystalline silicon carbide layers directly on the silicon wafer;
   forming amorphous and/or polycrystalline silicon carbide layers directly on the silicon wafer between the monocrystalline silicon carbide layers;
   forming first gallium nitride layers disposed on the monocrystalline silicon carbide layers; and
   forming second gallium nitride layers disposed on the amorphous and/or polycrystalline silicon carbide layers.

9. A method according to claim 8, wherein the silicon carbide layers comprise 3-step cubic silicon carbide.

10. A method according to claim 8, wherein the first gallium nitride layers comprise monocrystalline cubic gallium nitride.

11. A method according to claim 8, wherein the second gallium nitride layers comprise amorphous and/or polycrystalline gallium nitride.

12. A method according to claim 11, wherein said amorphous and/or polycrystalline gallium nitride layers are amorphous and/or polycrystalline cubic gallium nitride layers.

13. A method according to claim 8, wherein said forming spaced apart monocrystalline silicon carbide layers comprises:
   forming a masking layer having windows which expose corresponding regions of the silicon wafer, and
   forming the monocrystalline silicon carbide layers on the exposed regions of the wafer.

14. A method according to claim 13, wherein said forming amorphous and/or polycrystalline silicon carbide layers comprise:
   consuming the masking layer at an elevated temperature which results in further exposed regions of the silicon wafer adjacent the monocrystalline silicon carbide layers; and
   forming amorphous and/or polycrystalline silicon carbide layers on the further exposed regions of the silicon wafer.

15. A method according to claim 14, wherein the elevated temperature is about or above 1300° C.

16. A method according to claim 15, wherein the silicon carbide layers are formed on the silicon wafer using a reduced pressure chemical vapour deposition (RPCVD).

17. A method according to claim 8, wherein forming said first c gallium nitride layers comprises forming cubic monocrystalline gallium nitride on the monocrystalline silicon carbide layers.

18. A method according to claim 8, wherein forming said second gallium nitride layers comprises forming polycrystalline and/or amorphous gallium nitride on the amorphous and/or polycrystalline silicon carbide layers.

19. A method according to claim 8, wherein the gallium nitride layers are formed using a temperature less than about 1000° C.

20. A method according to claim 8, wherein forming the silicon carbide comprises forming silicon carbide having a thickness in a range between about 0.5 µm and about 5 µm.

21. A method according to claim 8, wherein forming the silicon carbide comprises forming silicon carbide having a thickness of about 2.5 µm.

22. A method according to claim 8, wherein the lateral distance between the centres of two adjacent polycrystalline silicon carbide layers is in a range between about 0.5 mm and about 5 mm.

23. A method according to claim 8, wherein the width of each polycrystalline silicon carbide layer is in a range of between about 25 µm and 100 µm.

24. A method according to claim 8, wherein the width of each polycrystalline silicon carbide layer is about 50 µm.

25. A method according to claim 8, further comprising cutting the polycrystalline and/or amorphous silicon carbide layers.

26. A method according to claim 8, wherein the width of the monocrystalline silicon carbide layers are substantially the same.

27. A method according to claim 8, wherein the width of the monocrystalline silicon carbide layers are different.

28. A method according claim 8, wherein said wafer is an off-axis wafer.

29. A method according to claim 8, wherein said wafer is an on-axis wafer.

30. A light emitting diode incorporating the semiconductor structure of claim 1.

* * * * *